United States Patent
Ayres

(10) Patent No.: US 6,665,857 B2
(45) Date of Patent: Dec. 16, 2003

(54) SYSTEM AND METHOD OF GENERATING INTEGRATED CIRCUIT MASK DATA

(76) Inventor: Ronald Frederick Ayres, 2807 Pacific Ave., Venice, CA (US) 90291

( * ) Notice: Subject to any disclaimer, the term of this patent is extended or adjusted under 35 U.S.C. 154(b) by 59 days.

(21) Appl. No.: 09/911,639

(22) Filed: Jul. 23, 2001

(65) Prior Publication Data

US 2002/0010904 A1 Jan. 24, 2002

Related U.S. Application Data

(60) Provisional application No. 60/220,396, filed on Jul. 24, 2000.

(51) Int. Cl.⁷ .............................................. G06F 17/50
(52) U.S. Cl. ........................................................ 716/19
(58) Field of Search ........................................... 716/19

(56) References Cited

U.S. PATENT DOCUMENTS

| | | | | |
|---|---|---|---|---|
| 5,448,494 A | * | 9/1995 | Kobayashi et al. ............. | 716/5 |
| 5,450,332 A | * | 9/1995 | Criscuoli et al. .............. | 716/21 |
| 6,056,785 A | * | 5/2000 | Chisaka ........................ | 716/19 |
| 6,189,135 B1 | * | 2/2001 | Chisaka ........................ | 716/19 |
| 6,330,708 B1 | * | 12/2001 | Parker et al. .................. | 716/19 |

OTHER PUBLICATIONS

Z. V. Apanovich et al., Decomp: A Technology Migration Subsystem for Full Chip Mask Layouts, 1997 IEEE Pacific Rim Conference on Communications, Computers and Signal Processing, pp. 942–945, Aug. 1997.*

Z. V. Apanovich et al., Top–Down Approach to Technology Migration for Full–Custom Mask Layouts, 1998 11th Internations Conference on VLSI Design, pp. 48–52, Jan. 1998.*

E. C. Carlson et al., Mask Verification on the Connection Machine, 25th ACM/IEEE Design Automation Conference, pp. 134–140, Jun. 1988.*

R. Chiang et al., From CIF to Chips, Proceedings of the Eighth University/Government/Industry Microelectronics Symposium, pp. 156–159, Jun. 1989.*

* cited by examiner

Primary Examiner—Leigh M. Garbowski
Assistant Examiner—A. M. Thompson

(57) ABSTRACT

Masks from which integrated circuits are manufactured are derived from layers found in integrated circuit designs. The mapping from design layers to mask layers produces masks with various essential properties. The operators that transform the design layers to the mask layers consist of the Boolean operations along with fattening and shrinking. This invention shortens the compute time used in carrying out these operations by keeping all temporary layers in main memory and never on disk, avoiding both disk space and access time as a result. Temporary layers are extra, intermediate layers used in computing the final mask layers. The savings are achieved by slicing the design into slightly overlapping pieces, each of which can fit in main memory, and carrying out the operations upon all layers of each piece before beginning the next piece.

20 Claims, 10 Drawing Sheets

SYSTEM AND METHOD OF GENERATING INTEGRATED CIRCUIT MASK DATA

CROSS-REFERENCE TO RELATED APPLICATION:

This application benefits from the Provisional Application:

Application Number: 60/220,396

Filing Date: 07/24/2000

Name of Applicant: Ronald F. Ayres

Title of Invention: Reduced Disk Access For Complex Mask Generation

BACKGROUND

The cloning of integrated circuits, today's crowning example of mass production, proceeds by copying information from a set of masks onto a wafer. The wafer starts as a disk of pure substrate, such as silicon. It is then augmented by a sequence of chemical treatments, each followed by exposure to radiation under a different mask. After this sequence of treatments under masks, a wafer emerges having finished circuitry on it. The wafer need only be cut in order to yield rectangular fragments called dice, or chips. The task is completed as each die is placed and connected into its final resting place.

In all cases, the entirety of the intended electronic circuitry is represented in the masks.

Due to the constant evolution of integrated circuit manufacturing technology, new capabilities arise quickly. For example, a new innovation might require a longer exposure to the radiation than before, introducing an unfortunate side-effect-the wires become thinner, too thin. Rather than redesigning the old integrated circuit, it is often easier just to manipulate the masks, after the fact, thus allowing old designs to continue to work on new technology. In this example, the mask manipulation would consist of fattening all shapes (wires) on the mask(s) involved, all to compensate for the unwanted side effect of shrinkage.

FIG. 1 shows the heart of the mask manipulation task. The given design to be committed to masks, our input, is delivered in what we call design layers, the original design intent 100. Our output, data to make masks, are called mask layers 110. Any other (temporary) layers that come to exist during the transformation from design layers to mask layers are called intermediate layers 120.

In common to all mask manipulation is the need to transform the original design layers into new, mask layers. These transformations consist of fattening and shrinking, along with the Boolean operations: OR, AND, NOT, etc. The Boolean OR operator, for example, proceeds by taking in a pair of corresponding pixels from two layers, performing the Boolean OR to produce the corresponding pixel on the resulting layer. Taken together, these are called layer operations, or Boolean+ operations.

The need for the Boolean manipulations may be seen by this example: Transistors are formed typically at the intersection of two design layers. By ANDing those two design layers together, we find all transistors. If evolving technology came to demand a new mask altogether, to represent just the transistors, we could produce that mask. More likely, the evolution would require a bloat or a shrink of that result.

In fact, today's available wealth of many metal layers, of great use for routing, is due to an advance that required suddenly a "minimum average density of metal" over the masks, even in unused regions. This minimum average density is fortunately solvable by Boolean+ operations, although the number of intermediate layers increases to accommodate this.

All of the details in the integrated circuit design patterns must go through software that implements these Boolean+ operators so as to produce workable masks.

The time required to execute that software can be large (hours). As the gymnastics required to meet the foundry's requirements increase over time, the complexity of the Boolean+ operators increases. More and more intermediate or temporary layers come to exist, just as we find intermediate results showing up in non-trivial software programs.

A notation consisting of equations may be used to specify the mask manipulations to be performed. The following equation defines a mask layer named Mask_Layer_1. The equation ANDs two design layers (X and Y) and then ORs that result with design layer Z:

Mask_Layer_1=( X and Y ) or Z

This equation has one intermediate layer, namely, the result from ANDing X and Y, even though we haven't given that intermediate layer a name.

Intermediate layers also arise naturally within sets of equations, as one might declare an intermediate layer explicitly, such as in:

Intermediate_1=X and Y

Mask_Layer_1=Intermediate_1 or Z

The result, Intermediate _1, may now be referenced multiple times in other equations. In fact, intermediate layers are found by taking the layer names appearing on equations' left-hand sides, excluding mask layers (outputs), and augmenting that with all operations that appear within other operations.

In the conventional art, each layer is represented by a file. The set of Boolean+ operations proceeds one at a time. Each operation reads one or two files as input layers and produces one file as the output layer. The entirety of the design (on the input layers) is read, and a file for the output layer is produced for the entire design.

Because a given file will typically not fit in RAM, the input files read and the output file produced cannot be buffered from one operation to the next, and so the disk IO is as slow as possible.

output layer may be a finished mask layer or an intermediate layer that will feed a subsequent operation. Notice that all layers, including intermediate layers, reside on disk at some time in the conventional art.

SUMMARY OF INVENTION

The present invention provides a speed up of the Boolean+ software by avoiding placing intermediate layers on disk. With the number of intermediate layers increasing, these disk access savings may become more significant in the future. In analogy to software optimizing compiler technology, we "keep the data in the registers" and avoid LOADs and STOREs to and from main memory, opening the potential for speedier execution.

The present invention circumvents the disk for intermediate layers by slicing the design into (slightly) overlapping regions, each small enough to fit in main memory. Each region is then processed in its entirety, i.e., all equations executed upon that region, before taking on the next region.

Thus all intermediate layers come to exist (in main memory) within one region at a time, and are then discarded before proceeding with the next region. The intermediate layers never go out to the disk. Within each region, temporary layers stay in main memory and may be referenced multiple times, as often occurs in equations, all without consulting the disk.

As a result, the only disk access besides to the original design and to the final output (MEBES) files, is an initial sorting of the design (already necessary for other reasons) that simultaneously places the design polygons in their separate regions.

The objective of the invention is to speed up the Boolean+ software by not placing intermediate layers on disk, which saves disk space, and more significantly, the time of disk access, all in anticipation of an increase in the number intermediate layers. A further objective is to allow such software to run on a multiplicity of inexpensive (uniprocessor) computers, in parallel. These objectives are met by regionalizing the heavily layered data into to regions small enough so that all layers fit in RAM within a region, and so can be treated independently. Another objective is to temper the invention so as to be practical even in the face of very large bloats and shrinks, by trading off large bloats and shrinks for disk residency of some subset of intermediate layers.

The details of one or more embodiments of the invention are set forth in the accompanying drawings and the description below. Other features, objects, and advantages of the invention will be apparent from the description and drawings, and from the claims.

Equations direct the transformation from input design layers to output mask layers, with intermediate layers showing up temporarily.

Figure 1:
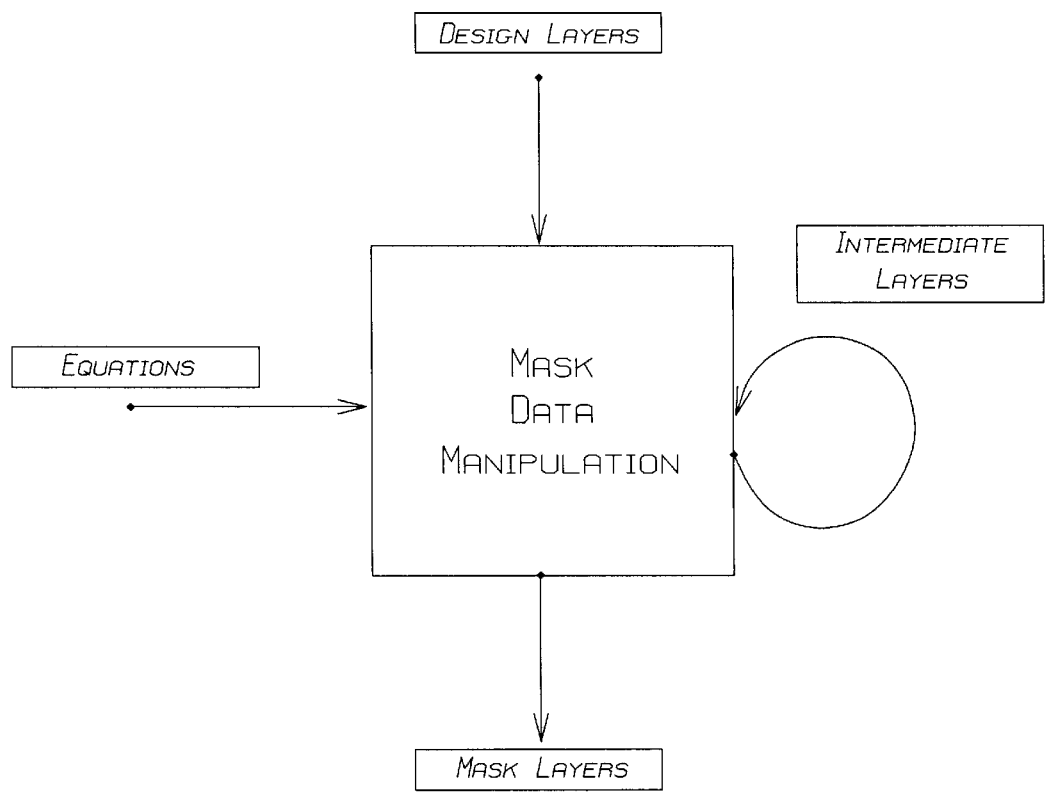
FIG. 1: Heart of Turning Design Layers into Mask Layers
Figure 2:
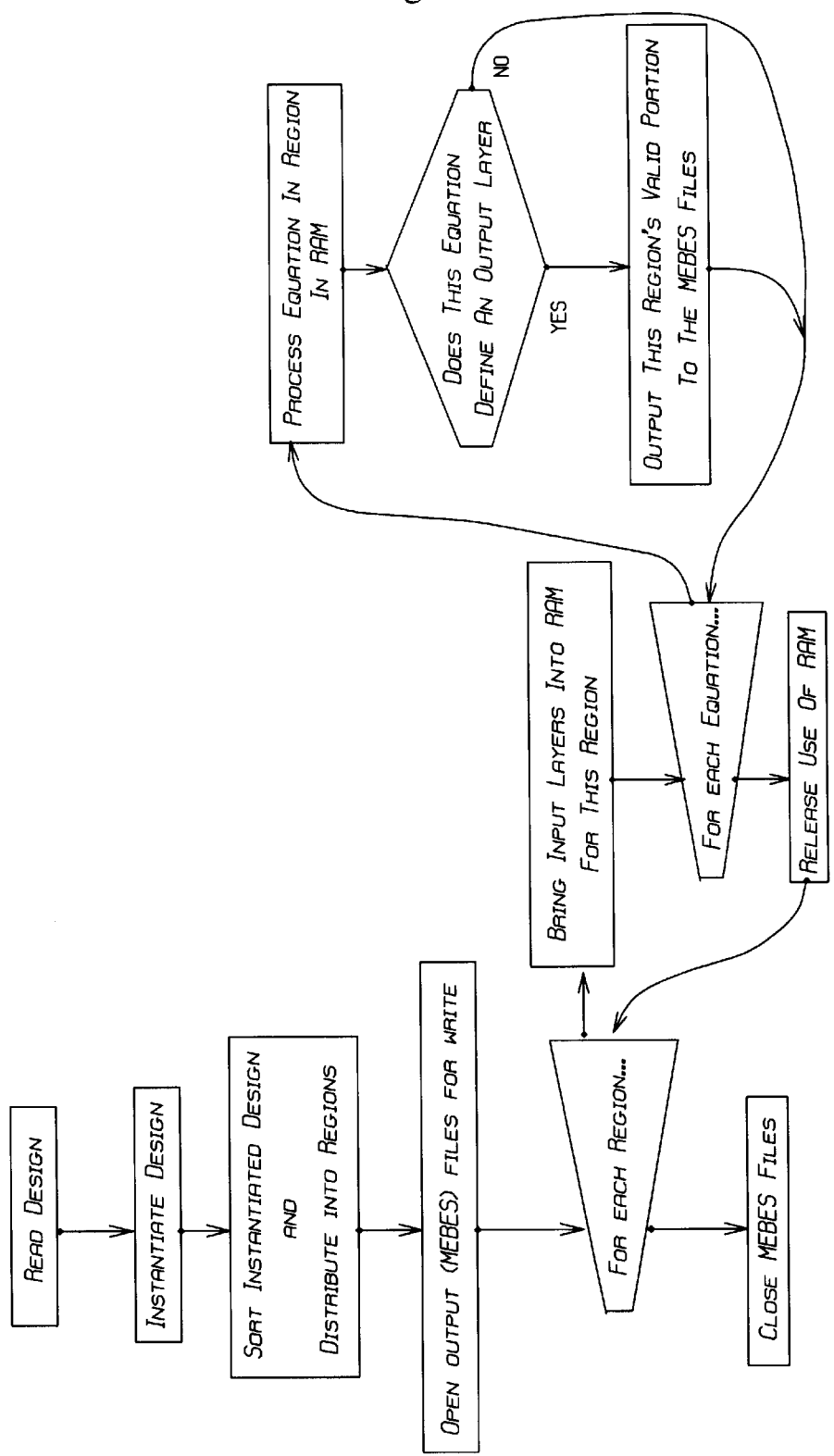

FIG. 2: Flow Diagram

Flow diagram for processing all regions with equations. Equations are assumed to be in levelized order. The bringing into RAM of the input design layers may be explicit, as shown here, or may be implicit, as with virtual memory or any other kind of demand swapping system.

Figure 3:
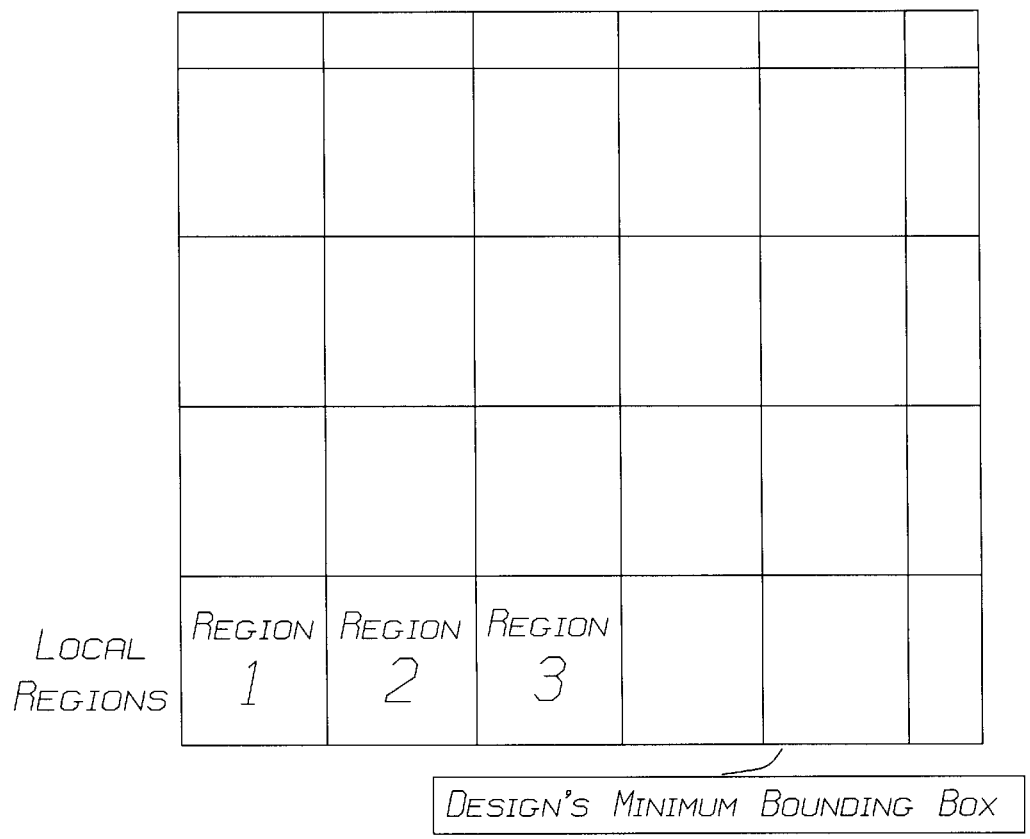

FIG. 3: Local Regions

A design is sliced into local regions, which will be processed independently, and intermediate results will remain in main memory and then discarded within each local region.

Figure 4:
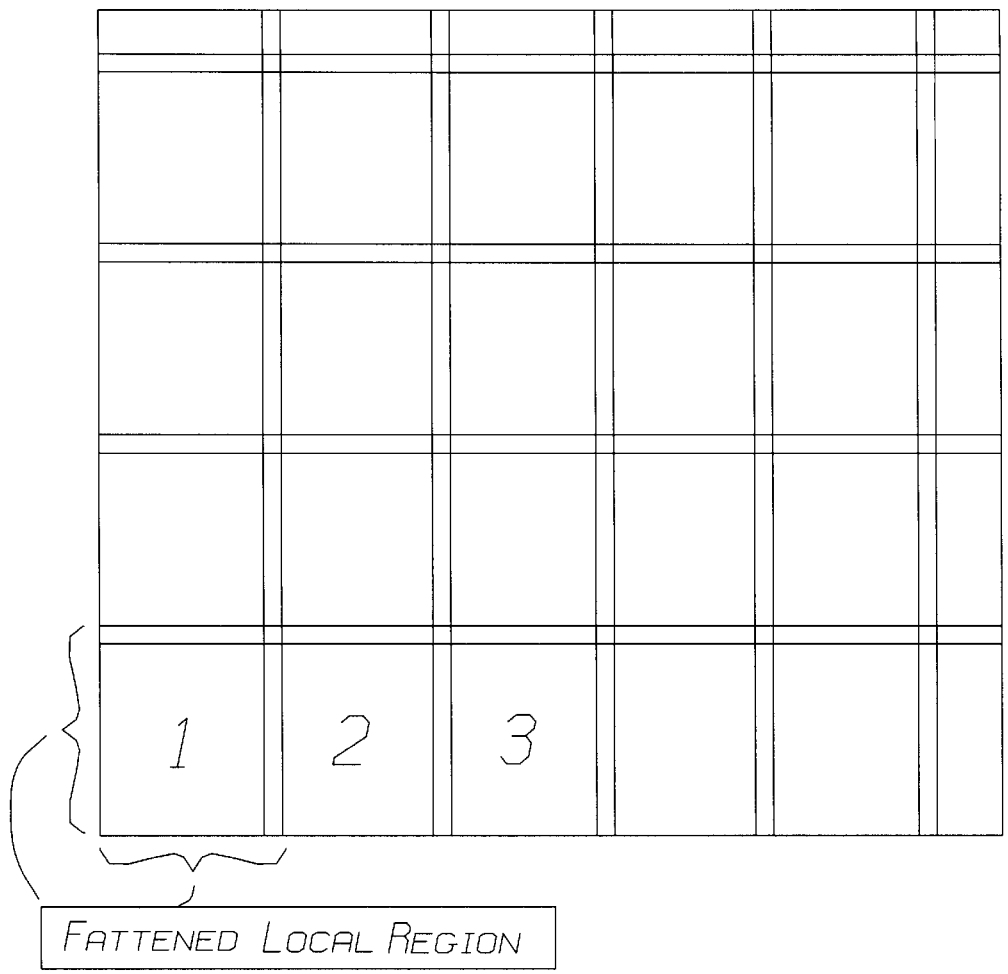

FIG. 4: Fattened Local Regions

Overlapping local regions provide for the independent processing of each region, even if bloating and shrinking of layers occurs.

Figure 5:
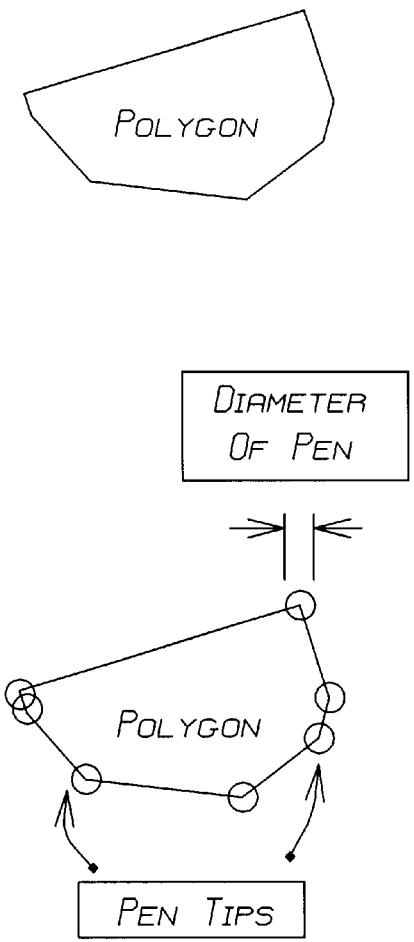
Figure 5:
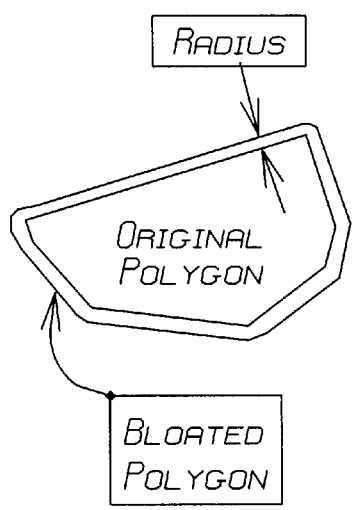

FIG. 5: What Bloating Is

Any polygon is bloated conceptually by redrawing its perimeter with a thick pen. The diameter of the pen is the total bloat amount. (Each edge is fattened by the pen's radius).

Figure 6:
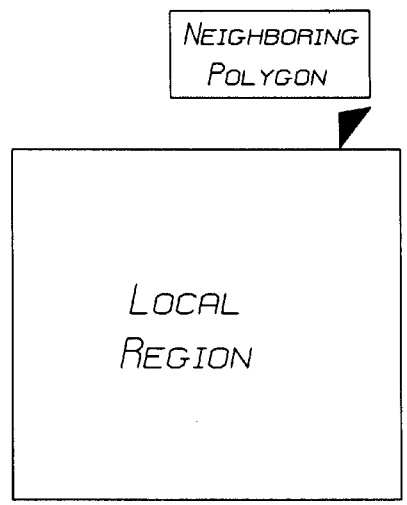
Figure 6:
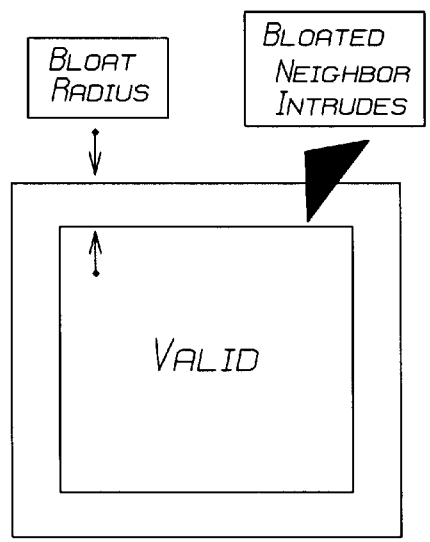
Figure 6:
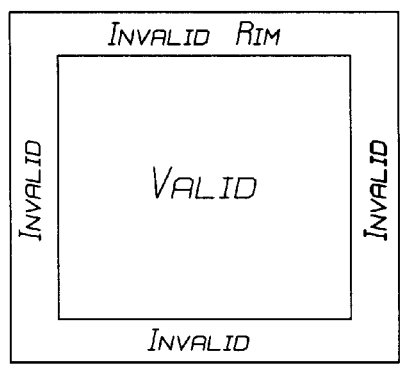

FIG 6: Invalid Rim due to bloating/shrinking

A bloat operation imposes a blindness around the rim of each isolated local region. Information from neighboring regions is unavailable.

Figure 7:
Figure 7:
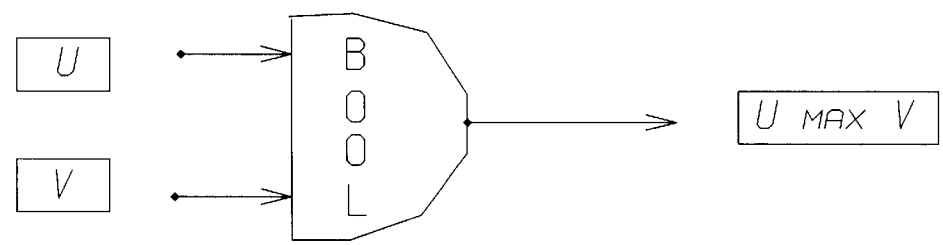

FIG. 7: Total Bloat

This shows how total bloat is computed from equation inputs to outputs. The first shows a bloat or a shrink (X positive), and the second shows any Boolean operation.

Figure 8:
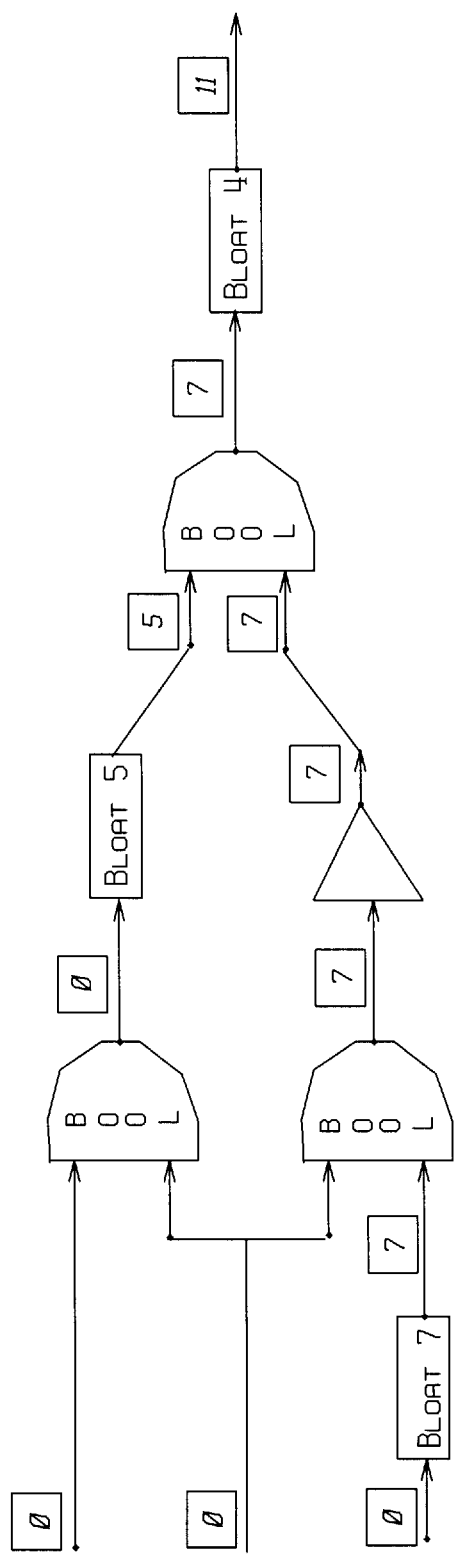

FIG. 8: Example Total Bloat

This shows how total bloat is computed, from left to right, from an equation containing four bloats and four Boolean operations (one of which is an inversion).

Figure 9:
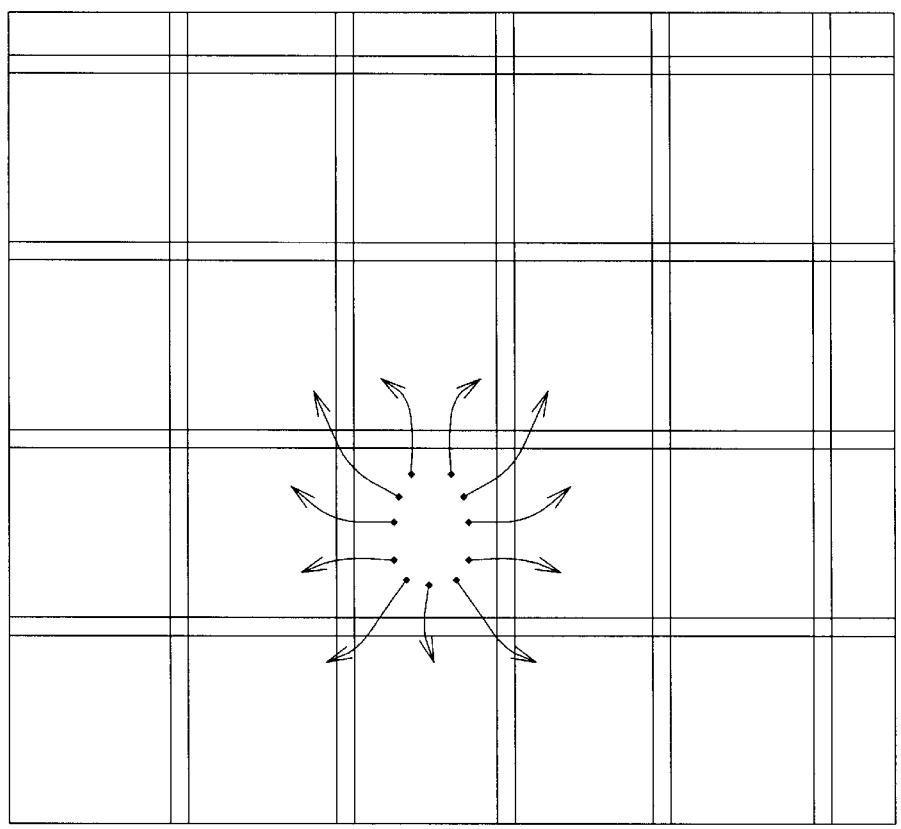

FIG. 9: Global Equations

Global equations arise if we artificially place an arbitrary upper bound on the invalid rim. Even when processing a single given local region, each global equation is unusual in that it writes to potentially all local regions.

Figure 10:
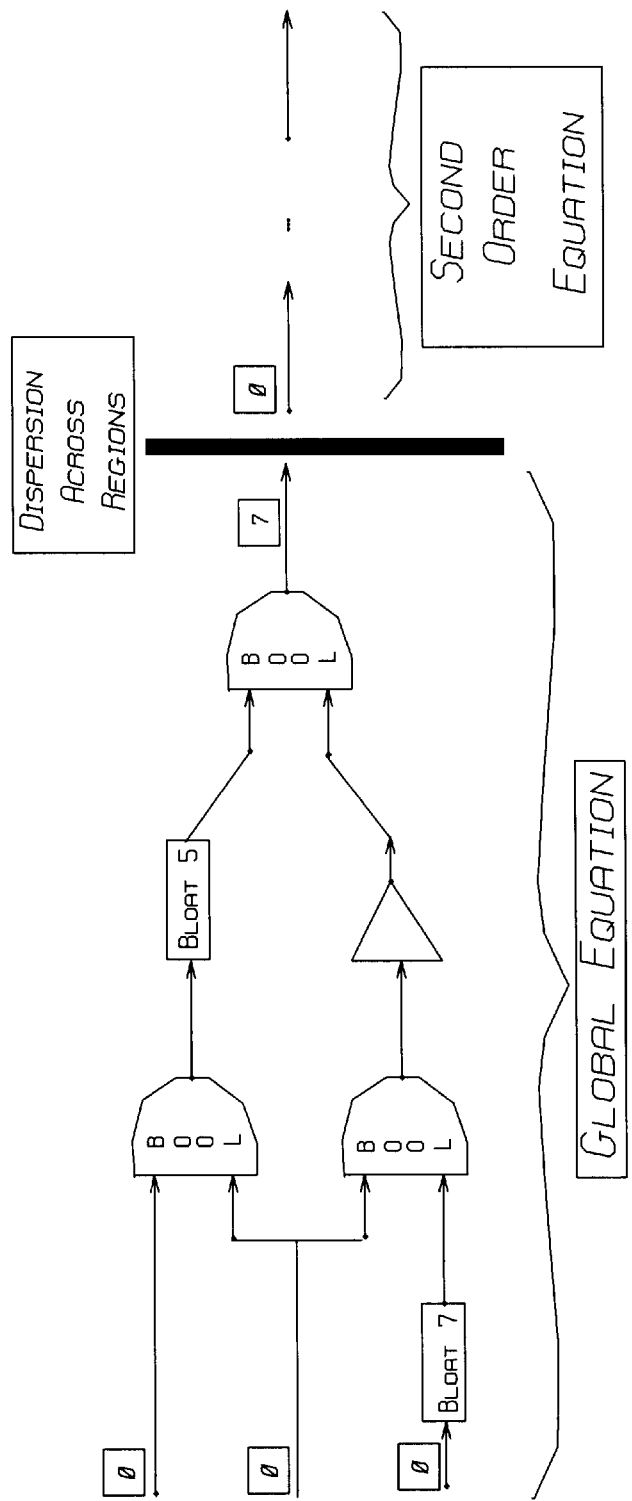

FIG. 10: Global Equations Reset Total Bloat to Zero

Global equations' outputs get their total bloat reset to zero, since global equations write to all regions without blindness, much like an input design layer is dispatched originally to the local regions without blindness.

DETAILED DESCRIPTION

The preferred embodiment of the invention is a system which produces mask layout files (MEBES) and the accompanying jobdeck from a set of design files, all of which are to "share the silicon" and be fabricated together. However, this invention is useful even if only one design file is fabricated. For clarity, from here on, let's assume one design file.

We begin by reading the design file, distributing all polygons to a set of local regions. The Boolean+ operations will occur in each local region independently, with intermediate layers residing in main memory. The final MEBES mask files will be all opened at the beginning, and will receive their shapes piecemeal but concurrently, on a per local region basis. When all local regions have been processed, the task is done and the MEBES files are closed. FIG. 2 illustrates this.

Distributing the Design's Polygons to the Local Regions

Each integrated circuit design comes in a design file. Within that design file, the integrated circuit layer may be represented concisely by a tree-like structure. Only by walking the entire tree, and some sub-portions many more times than once, does the actual, or instantiated design emerge. Our first step therefore is to walk the tree as required and to produce a (large) sequence of polygons.

These polygons need to be sorted for subsequent layer operations, and so n*log(n) time is required to sort all the polygons. The disk is used here, but the time and space used for this sorting are independent of the equations defining the ultimate mask layers.

The polygons can be divided into local regions whose union make up the entire design. FIG. 3 shows local regions.

Because the polygons come in sorted, they will go out to their various local regions in a localized manner, e.g., region #1 will be filled first, most of #2 will be filled next, etc. Polygons residing in more than one region are clipped into each region's portion. Thus, the entire integrated circuit design is rendered in local regions with basically one additional scan through the design. (Even that additional scan be avoided if a merge sort is used, as the final merging in the sort process can directly fill the regions instead of producing its final, sorted, output file.)

In fact, precisely because our Boolean+ operators include fattening and shrinking, and we want to work each local region independently, we need to enlarge each local region so that they all overlap, by the largest bloat amount, as shown in FIG. 4.

We will discuss further the largest bloat amount, but for now think of it as the sum of all bloats.

Note that each polygon may land in more than one region as the regions do overlap. Overlapping regions naturally may receive up to four copies of their intersection's portion of the polygon, as overlaps can involve up to four regions.

Processing Each Local Region Independently Without Bloats

Each local region consists of a set of layers residing in main memory. There is one layer per design (input) layer, as well as one for each intermediate layer. (Output layers that aren't also intermediate layers don't need representation in a local region.)

Each layer holds a set of polygons, or more accurately, a set of directed non-horizontal edges of trapezoids, which together form all the polygons. The edges (polygons) are then subjected to the Boolean+ operations between layers, e.g., by repeatedly reading two layers from the local region and writing the resulting layer back to the local region. These operations can be made to occur at a speed which is proportional to n*log(n) in the number of polygons in the region, and all new data stay in main memory.

If the equations happen to have no bloats nor shrinks, then the local regions don't need to overlap. At all times, the shapes in all local regions together represent the entire design. (For example, an AND over two layers of the entire design is accurately represented by the collection of independent ANDs over the set of local regions.)

Processing Each Local Region Independently With One Bloat

If the equations contain one bloat, then the local regions need to be extended by just the amount of that bloat, seen as a diameter. To be specific, a bloat is specified as a diameter in microns, as in an equation:

$$Fattened\_Metal=Metal+.5$$

Fattened_Metal is a copy of the Metal layer where all widths and heights are increased by .5 microns. This can be imagined by taking the Metal layer and then drawing around the perimeter of Metal with a pen whose tip is .5 microns in diameter. As FIG. 5 shows, the resulting polygon is fattened on each edge by half the diameter of the pen tip.

Shrinking is nothing more than bloating in inverse space, i.e., an inversion followed by a bloat followed by an inversion is a shrink.

Notice, in FIG. 6, how the outer rim of the local region becomes invalid after a bloat (shrink) operation. Polygons 600 from just outside the local region ooze into the local region due to their being bloated 610.

The radius of the bloat is as far as any point can move due to the bloat operation. Points moving from inside the local region to outside just get lost (truncated). On the other hand, points that move from outside the local region to inside are unknown to this local region. Because the local region cannot see the external polygons, there is a rim of invalidity or blindness 620 that has width equal to the radius of the bloat This local region can't see far enough away to correctly compute results for the invalid rim. It is the invalid rim that requires local regions to overlap. They overlap exactly so that the valid regions touch. In fact, the union of (touching) valid regions form the whole layout.

Work is indeed duplicated where local regions overlap. That is the cost of operating independently. Also, local regions may be processed in parallel because of this.

Processing Each Local Region With Multiple Bloats

Each bloat or shrink operation reduces the valid subregion (increases the invalid rim) of each local region. The invalid rim has width equal to the largest of any sum of bloats (and magnitudes of shrinks) that depend on one another. For example, the pair of equations (with two bloats):

$$Fattened\_Metal=Metal+1(diameter)$$

$$Obese\_Metal=Fattened\_Metal+1(diameter)$$

depend on one another, as Obese_Metal reads Fattened_Metal. An invalid rim of diameter 2=1+1 (radius 1.0=0.5+ 0.5) microns therefore arises. The invalid rim's width is this radius.

An example of independent bloats, which DO NOT have to be added together in forming the invalid rim follows:

$$Fattened\_Metal=Metal+1$$

$$Fattened\_Poly=Poly+1$$

Both of these equations may be executed and the invalid rim has width of only 0.5 micron radius, because neither equation reads the result of the other.

Each equation has what we call a total bloat. The total bloat of an equation is the maximum over the total bloats of each equation defining an input to this equation, summed with any bloat this equation applies to that input. It is the total bloat that must not exceed our arbitrary invalid rim. FIG. 7 shows the general rules for computing total bloat: 700 shows bloat and 710 shows any Boolean operation. (X is the positive bloat or shrink amount). FIG. 8 shows an example equation with three bloats, along with the total bloat at each node The maximum total bloat over all equations determines the width of the invalid rim.

Taking Output from the Local Regions

Equations that define outputs, actual finished mask layers, write directly to their output files (e.g., MEBES). MEBES writing occurs concurrently, with all MEBES files open simultaneously throughout the visitation of all local regions.

The present invention's valid regions within local regions form the entire valid geometry, and the regions may be designed to correspond with the MEBES file format's own locality requirements (its own decomposition into regions called stripes). Local regions may be designed so that their valid regions each corresponds to one MEBES stripe, or to a fraction thereof, or a multiple of stripes.

The order in which the invention visits local regions can be made to follow the locality requirements of the MEBES format, so data are written sequentially within each MEBES file.

Less Overlap vs. Less Locality—a trade off

Large bloats (and shrinks) may push the invalid rim to too large a size. One may prefer not to duplicate too much work resulting from too much overlap. We can simply impose an arbitrary invalid rim, and accommodate that decision by writing some of the intermediate layers to disk.

The embodiment recognizes equations' dependencies along with their bloats and shrinks, and will allow the accumulation of only so much total bloat (shrink) before breaking a subset of equations. Without loss of generality, let's assume each equation specifies at most one operation, e.g., an AND or a bloat.

Consider equations rendered in levelized order, so that values are defined before they are read. The first equation whose total bloat exceeds our arbitrary, invalid rim is separated out and called a global equation. Global equations write not to the present local region, but to potentially all local regions, as illustrated in FIG. 9.

The outputs of global equations are not valid for any local region until all local regions have been processed. Equations that read the outputs of global equations are called second-order equations. Second-order equations can't run until all local regions have been completed for the first-order equations.

Because global equations write to overlapping local regions (like any original input design layer), the invalid rim is zero for the results of these equations-there is no blindness in this operation. The total bloat for each global equation is thus reset to zero. FIG. 10 illustrates this.

After separating out the first global equation, continue scanning the levelized equations to find the next global equation, and so on.

One stores to disk all intermediate layers that are read by second-order equations because these equations' evaluation must be delayed until after all the first-order equations have executed in their entirety globally.

Note that even second order equations by themselves could exceed the arbitrary invalid rim. This gives rise naturally to third order equations, and so on. As a result, a series of passes occurs overall, one for the first order equations, one for second order equations, another for third order equations and so on.

Generally, the smaller the arbitrary invalid rim, the more passes may arise.

Implementation

The invention may be implemented in hardware or software, or a combination of both (e.g., programmable logic arrays). Unless otherwise specified, the algorithms included as part of the invention are not inherently related to any particular computer or other apparatus. In particular, various general purpose machines may be used with programs written in accordance with the teachings herein, or it may be more convenient to construct more specialized apparatus (e.g., integrated circuits) to perform particular functions. Thus, the present invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

Although the present invention has been described in terms of a preferred embodiment, it will be apparent to those skilled in the art that many alterations and modifications may be made to such embodiments without departing from the teachings of the present invention. Accordingly, it is intended that all such alterations and modifications be included within the scope and spirit of the invention as defined by the appended claims.

What is claimed is:

1. A method of generating mask layer layout data for an integrated circuit, including the steps of:
    (a) defining a rectangular region size, to be used to partition geometrically a given integrated circuit design into adjacent regions;
    (b) defining a constant amount of overlap between the adjacent regions, which, along with said rectangular region size, defines a set of overlapping rectangular regions corresponding to the given integrated circuit design;
    (c) reading layout layers in electronic form from an integrated-circuit design file and writing a set of polygons for each layer onto a storage device; wherein one or more sets of polygons are generated for the integrated circuit design;

2. The method of claim 1, where said rectangular region size is sufficiently small geometrically so that a representation of all polygons on all layers of any single region of that size can be stored in a random access memory.

3. The method of claim 1, where the constant amount of overlap between adjacent regions is computed automatically from a given set of mask equations by the steps of:
    (a) dividing any mask equation that specifies two or more mask operations into multiple single equations, so that each single equation represents one Boolean+ operation, and wherein the single equation has one output layer and one or two input layers;
    (b) associating with each single equation a total bloat, specified as a bloat distance, defined as follows:
        (1) For a bloat or shrink equation associated with a bloat amount b, the total bloat for such equation is b+ the total bloat of the equation whose output defines such equation's input layer;
        (2) For a Boolean equation, the total bloat for such equation is a maximum one of the total bloats of the equations whose outputs define this equation's inputs;
    (g) setting the desired constant amount of overlap between regions as the maximum over all equations' total bloats.

4. The method of claim 3, where "excessive" accumulated bloats and shrinks, which cause more overlap are reduced by partitioning the equations into a sequence of global passes, where each pass achieves reduced bloating and shrinking, by the steps of:
    (a) picking an arbitrary maximum for the constant amount of overlap between adjacent regions, including a maximum allowed bloat;

5. The method of claim 4, where "excessive" is defined to be between 5% and 10% of the linear dimension of said rectangular region size.

6. The method of claim 1, where said overlapping rectangular regions are processed in parallel on one multiprocessor computer.

7. The method of claim 1, where said overlapping rectangular regions are processed in parallel on many computers.

8. The method of claim 1, where a merge sort using a merge sort algorithm is used in step (d), and a final merge step in the merge sort is avoided altogether, by the step of:
    (a) Having the final merge step produce not a final file of sorted polygons, but rather, distribute polygons resulting from an almost complete merge sort algorithm, less the final merge step. into the overlapping rectangular regions.

9. A method of generating mask layer layout data for an integrated circuit, including the steps of:
   (a) processing a design layer file so that a mask layout for a substrate is divided into a set of regions;
   (b) carrying out Boolean+ operations for each region of said set of regions to generate one or mote mask output files;
   (c) discarding intermediate layers generated for each said region created during step (b) before initiating processing in accordance with step (b) for a subsequent region of said set of regions;
       wherein adjacent regions in said set of regions overlap, including at least in areas where said Boolean+ operations require bloating.

10. The method of claim 9, wherein said one or more mask output files are open simultaneously and are updated simultaneously as operations are completed for each region.

11. The method of claim 9, wherein all Boolean+ operations are performed for a first region of said set of regions before any Boolean+ operations are performed on a second region of said set of regions.

12. The method of claim 9 further including the steps of: (d) identifying polygons within the design layer file corresponding to elements of an integrate circuit design; (e) distributing said polygons to said set of regions.

13. The method of claim 9, wherein said Boolean+ operations include fattening and shrinking operations.

14. The method of claim 9, wherein steps (a) through (c) are implemented as a computer program embodied in machine readable media that executes on one more computing systems.

15. A method of generating mask layer layout data for an integrated circuit, including the steps of:
   (a) processing a design layer file so that a mask layout for a substrate is divided into a set of regions;
   (b) carrying out Boolean+ operations for each region of said set of regions to generate one or more mask output files;
   (c) discarding a number of intermediate layers generated for each said region created during step (b) before initiating processing in accordance with step (b) for a subsequent region of said set of regions;
       wherein adjacent regions in said set of regions overlap, including at least in areas where said Boolean+ operations require bloating;
       further wherein a number of intermediate layers discarded during step (c) is determined on a region by region basis by considering an amount of overlap present between two adjacent regions.

16. The method of claim 15, wherein in the event of no overlap between a first region and one or more second regions, all of said intermediate layers for said first region are discarded.

17. The method of claim 15, wherein any intermediate layers that are not discarded are used for writing out mask data for more than one region at a time.

18. The method of claim 15, wherein said one or more mask output files are open simultaneously and are updated simultaneously as operations are completed for each region.

19. The method of claim 15, wherein steps (a) through (c) are implemented as a computer program embodied in machine readable media that executes on one more computing systems.

20. The method of claim 15, wherein said set of regions correspond to stripes used in a MEBES mask file format.

* * * * *